(12) United States Patent
Kirshner et al.

(10) Patent No.: US 8,217,577 B2
(45) Date of Patent: Jul. 10, 2012

(54) HYBRID MODULATION IN AN EMISSION-GATED ELECTRON GUN

(75) Inventors: Mark Frederick Kirshner, Redwood City, CA (US); Craig Bisset Wilsen, Redwood City, CA (US); Richard Donald Kowalczyk, San Francisco, CA (US); Carter Michael Armstrong, Danville, CA (US)

(73) Assignee: L-3 Communications Corporation, San Carlos, CA (US)

( * ) Notice: Subject to any disclaimer, the term of this patent is extended or adjusted under 35 U.S.C. 154(b) by 506 days.

(21) Appl. No.: 12/551,174

(22) Filed: Aug. 31, 2009

(65) Prior Publication Data

US 2011/0050097 A1     Mar. 3, 2011

(51) Int. Cl.
*H01J 29/46*     (2006.01)
(52) U.S. Cl. ............ 315/15; 315/5.14; 315/5.37
(58) Field of Classification Search ............ 315/15, 315/14, 3.5, 5.14, 5.16, 5.33, 5.37, 5.39, 315/5.59
See application file for complete search history.

(56) References Cited

U.S. PATENT DOCUMENTS

| | | | |
|---|---|---|---|
| 2,484,643 A | 10/1949 | Peterson | |
| 2,813,997 A | 11/1957 | McArthur | |
| 5,355,093 A * | 10/1994 | Treado et al. | 330/45 |
| 6,297,592 B1 * | 10/2001 | Goren et al. | 315/3.5 |
| 6,380,803 B2 | 4/2002 | Symons | |
| 6,636,534 B2 | 10/2003 | Madey et al. | |
| 6,653,628 B2 | 11/2003 | Lee et al. | |
| 7,129,504 B2 * | 10/2006 | Voss et al. | 250/423 R |
| 7,688,132 B2 | 3/2010 | Kirshner et al. | |

* cited by examiner

*Primary Examiner* — James H Cho
(74) *Attorney, Agent, or Firm* — O'Melveny & Myers LLP

(57) ABSTRACT

An apparatus and method of modulating an electron beam to induce a high degree of spatial bunching uses multiple control grids located in close proximity to an electron-emitting cathode. An RF field couples to the electron beam in the cathode-grid gap to induce velocity modulation. The electron beam then propagates through a first control grid, allowing the velocity modulation to induce spatial bunching. The electron beam then traverses a gap between the first grid and a second control grid and interacts with the RF field to induce further bunching of the beam. Simulations show that bunching factors of 50:1 may be achieved.

16 Claims, 4 Drawing Sheets

HYBRID MODULATION IN AN EMISSION-GATED ELECTRON GUN

BACKGROUND OF THE INVENTION

1. Field of the Invention

The present invention relates to emission-gated electron sources and more particularly to an apparatus and method for significantly compressing current pulses in an electron source to enable applications such as frequency multipliers and terahertz frequency sources.

2. Description of Related Art

In a conventional emission-gated microwave vacuum tube amplifier, the electron beam is density modulated at the electron gun. The most common technique applies an input signal to a resonant cavity to develop peak RF fields between the cathode surface and a closely-spaced control grid. At favorable phases, the RF field enhances emission such that the electron beam is modulated at the drive frequency and amplitude. Beyond the control grid, the beam is accelerated by anode potential. An output cavity extracts the amplified RF current from the beam. Such an approach is generally used in the design of an inductive output tube (IOT), an example of which is illustrated in FIGS. 1 and 2.

Typically, the control grid of an IOT is biased to generate an idle current. At low drive levels, this allows for Class A modulation, by which the electron beam is modulated over the full RF cycle. At high drive levels, the RF voltage overwhelms the grid bias such that emission is suppressed during the negative half cycle, enabling Class B operation. If the grid bias is adjusted more negative, Class C operation can be achieved whereby the cathode emits over less than half of an RF cycle. This produces a shorter bunch of electrons, which reduces the phase variation, or transit angle, in the output gap, thereby improving electronic efficiency. However, Class C operation requires more drive power to produce a given beam current, thereby reducing gain. Class C operation is thus not typically used in conventional IOTs.

Nevertheless, for certain applications and in certain devices, reducing the pulse width is necessary. For example, in frequency multipliers, which are under increasing consideration as a means for generating terahertz radiation, the rate of phase variation in the output gap is multiplied by the same factor as the frequency, requiring proportional compression of the current pulse. At best, however, this technique reduces the pulse width by only fifty percent, sufficient only for frequency doublers. Accordingly, it is desirable to provide an apparatus and method for achieving far greater electron pulse compression factors in order to enable, for example, a frequency multiplier driven at X-band to produce output power at sub-millimeter wavelengths.

SUMMARY OF THE INVENTION

An apparatus and method for achieving high pulse compression factors in an electron beam comprises an electron gun with an input cavity coupled to a radio-frequency drive circuit for coupling a modulating RF signal into the cavity. An electron-emitting cathode is located within the cavity and is biased with a voltage potential relative to an anode located outside of the cavity such that an electron beam is emitted from the cathode and propagates toward the anode. A first control grid is located within the input cavity and in close proximity to the cathode, defining a cathode-grid (G-K) gap between the cathode and the first control grid. A second control grid is located in close proximity to the first control grid, defining a grid-to-grid gap between the first and second control grids. As the electron beam is emitted from the cathode, it enters the G-K gap, where it interacts with the RF signal coupled into the cavity and acquires a velocity modulation. The electron beam then enters the first control grid, where it is shielded from the RF field, and the velocity modulation of the electron beam creates spatial bunching of the beam. The beam then emerges into the grid-to-grid gap where it again interacts with the RF field, and the spatial bunching is intensified.

In one embodiment of an electron gun in accordance with the present invention, the first control grid is selected to be thicker than the second control grid. And in another embodiment, the thickness of the first control grid is selected to be approximately equal to one quarter of the plasma wavelength of the electron beam.

In an alternative embodiment of an electron gun in accordance with the present invention, a third control grid is located in close proximity to the second control grid and defines a second grid-to-grid gap between the second control grid and the third control grid. As the electron beam emerges from the second control grid, into the second grid-to-grid gap, the RF signal interacts with the electron beam to further intensify the spatial bunching. Other embodiments having more than three control grids are also possible and would similarly fall within the scope and spirit of the present invention.

In alternative embodiments of an electron gun in accordance with the present invention, the cathode may comprise a thermionic electron source, a field-emissive cathode electron source, or a photo-emissive cathode electron source. Other types of electron sources may also be used and would similarly fall within the scope and spirit of the present invention.

Thus, certain benefits of an electron gun employing a hybrid modulation technique to produce a highly-bunched electron beam have been achieved. Further advantages and applications of the invention will become clear to those skilled in the art by examination of the following detailed description of the preferred embodiment. Reference will be made to the attached sheets of drawing that will first be described briefly.

DETAILED DESCRIPTION OF THE PREFERRED EMBODIMENT

Figure 1:
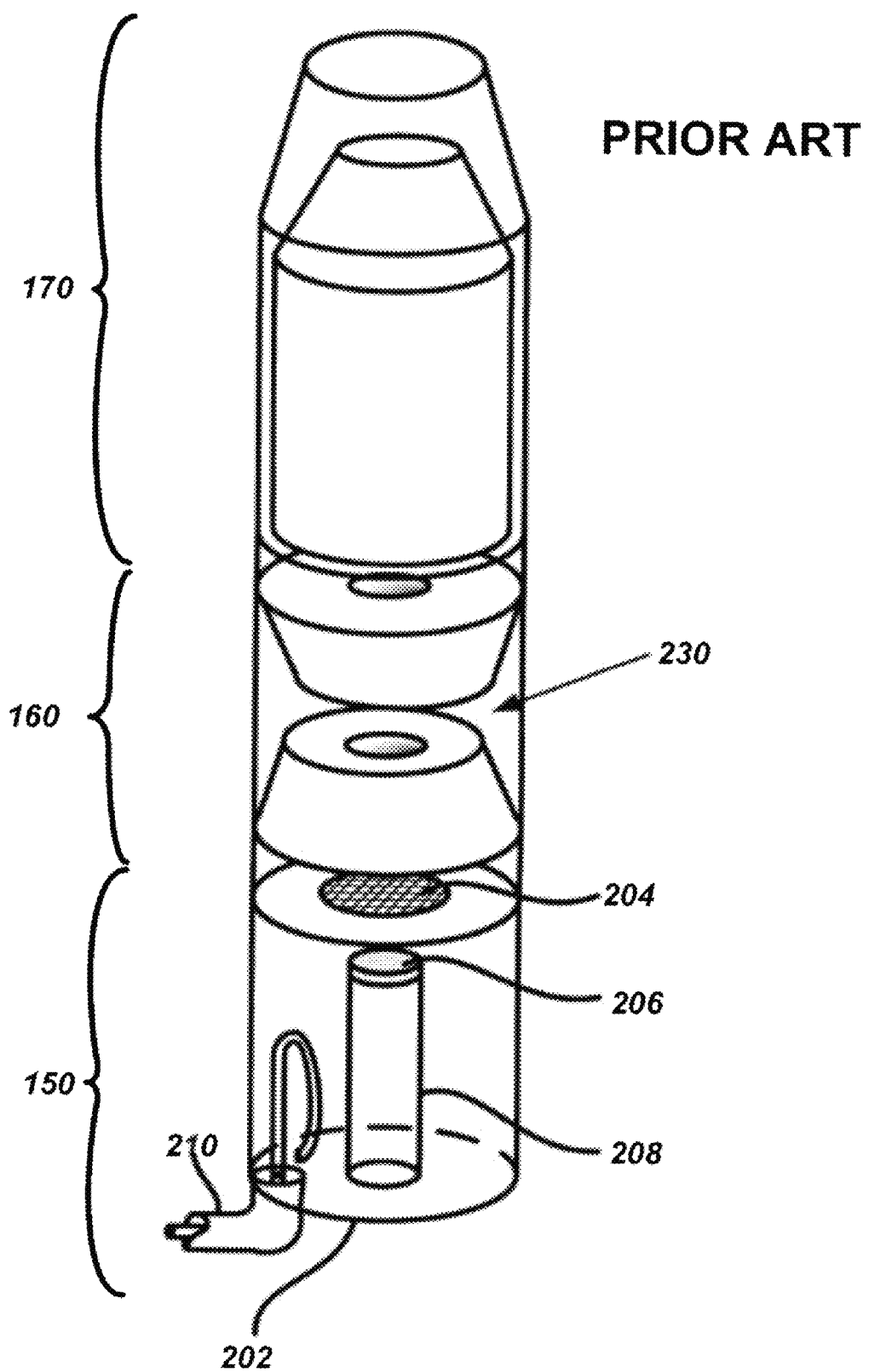
FIG. 1 depicts an exemplary inductive output tube (IOT), typical of the prior art.

The invention provides an apparatus and method for achieving hybrid modulation of an emission-gated electron gun in order to significantly compress the current pulses as compared to what can be achieved by conventional electron guns. An IOT, typical of the prior art, is illustrated in FIG. 1. The IOT includes three major sections, including an electron gun 150, a tube body 160, and a collector 170. The electron gun input cavity 202 provides an axially directed electron beam that is typically density modulated by an RF signal coupled into the input cavity through coaxial transmission line 210. The electron beam passes through a drift region 230 and then into the collector 170. The electron gun 150 includes a cathode 206 atop a support structure 208, and a control grid 204 in close proximity to the cathode 206. The control grid 204 is coupled to a bias voltage source to maintain a DC bias voltage relative to the cathode 206. The RF signal is coupled between the control grid 204 and cathode 206 in order to density modulate the electron beam emitted from the cathode 206. The grid 204 may be biased sufficiently negative to induce Class C operation. This produces a shorter bunch of electrons. However, this method does not produce an electron beam that is sufficiently bunched to support frequency multiplication by a factor of more than two or three.

Figure 2:
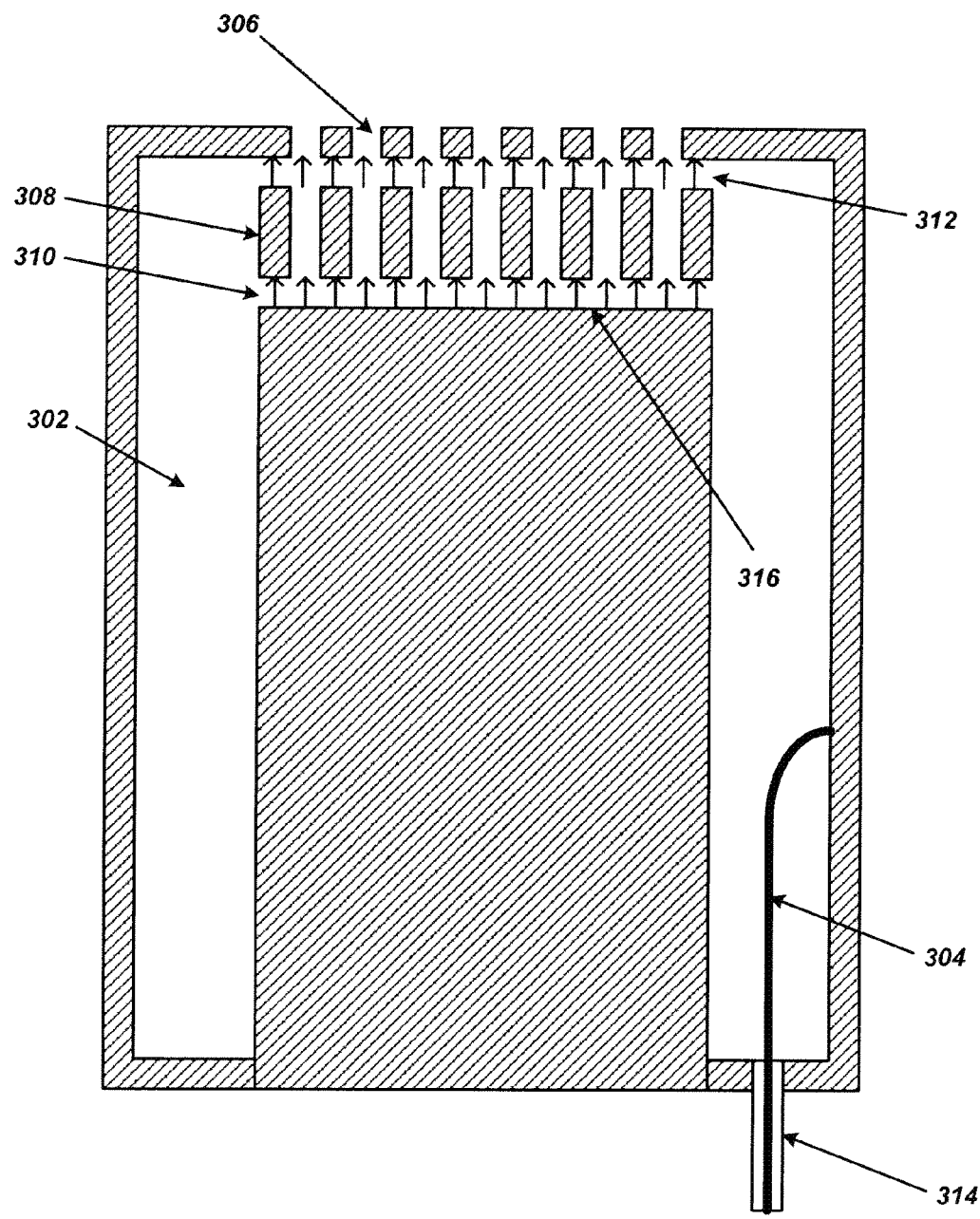
FIG. 2 is a schematic drawing of a dual-grid emission-gated electron gun in accordance with an embodiment of the present invention.

FIG. 2 is a cross section of an embodiment of an emission-gated electron gun in accordance with the present invention. Modulation of an electron beam produced by the electron gun is achieved by coupling an RF signal into cavity 302 from coaxial feed line 314 via inductive loop 304. The gun is designed with a hybrid modulation structure to enhance performance. The control grid structure is configured to exploit the component of velocity modulation introduced as a byproduct of emission gating. In the preferred embodiment, illustrated in FIG. 2, two control grids 308 and 306 are employed instead of the single grid conventionally used. The two grids 308 and 306 are stacked above the cathode 316 to provide sequential RF interaction gaps 310 and 312. The low energy of the electrons as they pass through the first control grid 308 allows the velocity modulation initiated in the G-K gap 310 to form the electrons into tight bunches in the short distance between the gaps 310 and 312, which is also the thickness of the first control grid 308. When the bunched electrons enter the second gap 312, the RF fields intensify the compression. The thickness of the grids is chosen to provide the required transit angle: optimal bunching is achieved over a path length equal to approximately one quarter of the plasma wavelength. The thickness of the grids is also chosen to isolate the interaction gaps 310 and 312 from the anode field, to which the electron beam is exposed once it has passed through the second control grid 306. In the preferred embodiment, the thickness of the first control grid 308 is greater than that of the second control grid 306.

Figure 3:
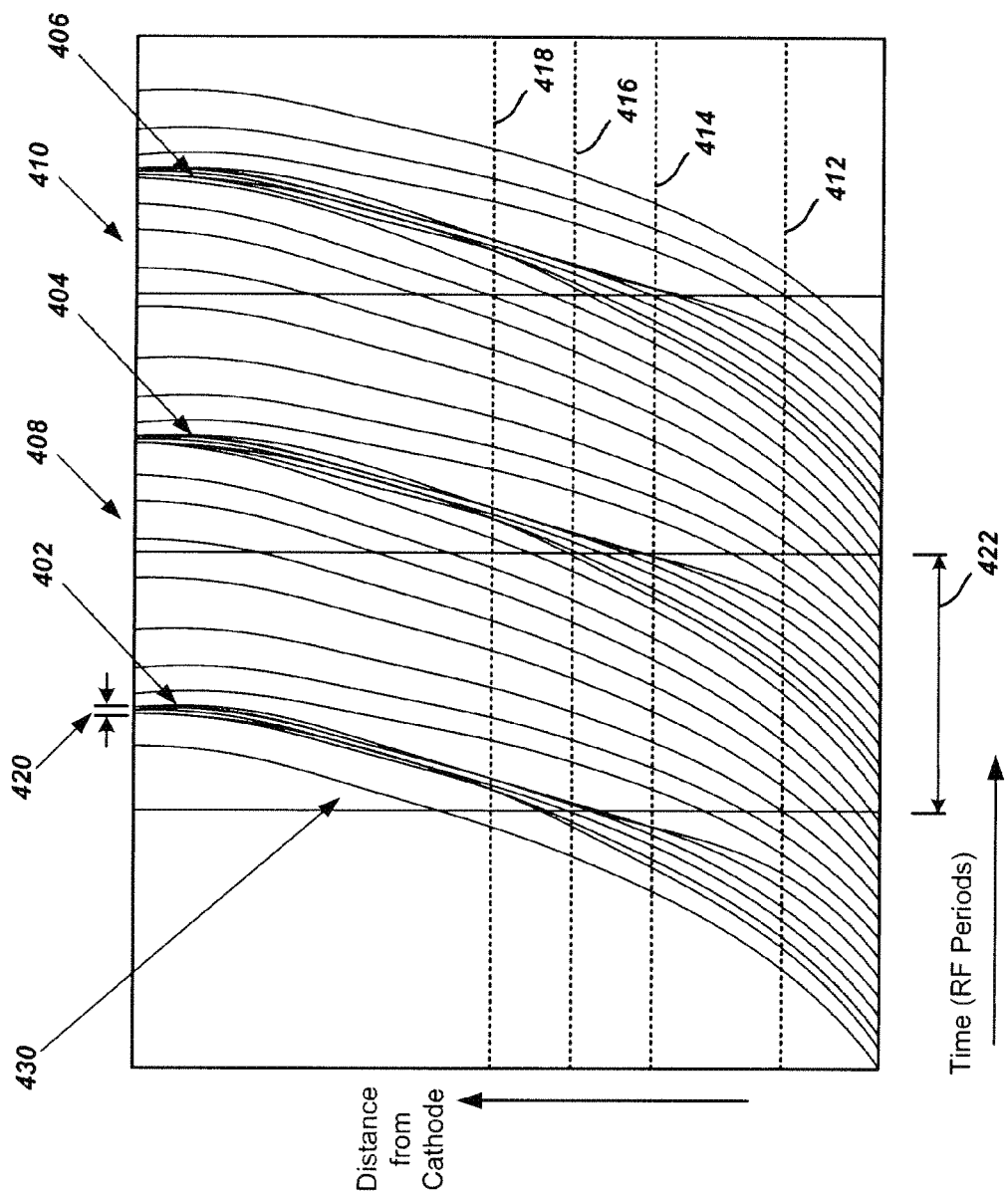
FIG. 3 is an Applegate diagram of simulated results showing the electron bunching performance that may be achieved by an embodiment of an electron gun in accordance with the present invention.

Applegate diagrams are known in the art as a method of graphing electron paths in an electron tube, showing how electron bunching occurs. FIG. 3 is an Applegate diagram of an embodiment of an electron gun in accordance with the present invention, depicting the evolution of the electron trajectories as they pass from the cathode through both control grids of the electron gun. Modeled electron trajectories 430 are plotted as distance from the cathode as a function of time. A simple one-dimensional model is used that neglects space-charge effects. Electrons are emitted from the cathode and accelerated in response to the RF electric field in the G-K gap between the cathode and first control grid. The position of the first control grid is indicated at 412. The phase progression of the electric field with time causes a degree of velocity modulation. The thick lower grid provides a field-free drift region 308 (see FIG. 2) in which the electrons form bunches in response to this velocity modulation. The thickness of the lower grid 308 also controls the entrance phase at the interaction gap 312 between the two grids. Additional velocity modulation occurs in response to the RF fields in the second gap 312, reinforcing the bunching. The second grid also serves to screen out the anode field. It has been shown using time-domain beam optics simulations that the emission-gated electron gun with hybrid modulation produces extremely short electron bunches using a relatively low excitation frequency. Electron bunches much shorter than half of an RF period of the input signal are produced. Returning to FIG. 3, electrons indicated by traces 430 are emitted from the cathode, traverse the G-K gap, and enter the first control grid at 412. They traverse the first control grid and emerge into the second gap at 414. They then enter the second control grid at 416, and finally, exit the second control grid and begin moving under the influence of the anode field at 418. As can be observed from the simulation, the effect of the control grids is to bunch the electron beam into tightly bunched regions 402, 404, and 406, alternating with anti-bunched regions 408 and 410 that repeat as a function of the RF drive period 422. The device can achieve very high compression factors, as can be seen from the small spatial spread 420 of the electron trajectories within a bunched region.

The production of extremely short electron bunches is essential for frequency multiplying devices but may also improve the performance of conventional amplifiers, such as high-gain IOTs. Another opportunity offered by hybrid modulation is the possible extension of IOT operating frequencies above L-band, which is currently its upper limit. Using the dual-grid configuration, a bunch modulation compression ratio of 50:1 has been achieved in the beam optics simulations.

In conventional velocity-modulated devices, such as klystrons, the velocity modulation is applied only after the electron beam is accelerated to full voltage. Conversion to density modulation then necessitates a lengthy drift region for the formation of tight electron bunches. On the other hand, conventional emission-gated devices, such as IOTs, make no attempt to exploit the velocity modulation introduced in the G-K gap, instead accelerating the density-modulated electron beam directly through an output cavity. The hybrid modulation approach of the present invention converts the velocity modulation to electron bunches in the low-velocity grid region, in contrast to other proposed devices, for example, an IOT equipped with klystron-like buncher cavities. The dual-grid configuration for hybrid modulation is also distinct from the familiar practice of positioning a shadow grid between the cathode and the control grid. In that case, the shadow grid is not used for RF modulation, but rather is biased at cathode potential to steer the electron beam through the apertures of the control grid to minimize interception. The hybrid modulation approach differs from existing emission-gated devices in its ability to compress the emitted RF current pulse by over an order of magnitude.

It should be appreciated by those skilled in the art that the hybrid modulation concept disclosed has applicability not only to thermionic sources but also to field-emissive and photo-emissive cathodes. Although an embodiment of the invention has been described with respect to RF interaction gaps, it is also possible to use travelling wave excitation. Planar, coaxial, and other geometries are feasible. In the case of a dual-grid gun, for example, the two control grids may be individually biased and the RF gaps can be excited by a common mode or by independent resonators. Hybrid modulation can also be implemented in a single RF gap if adequate screening of the anode field is provided. Similarly, hybrid modulation can be implemented in a multi-grid configuration using three or more RF gaps.

Figure 4:
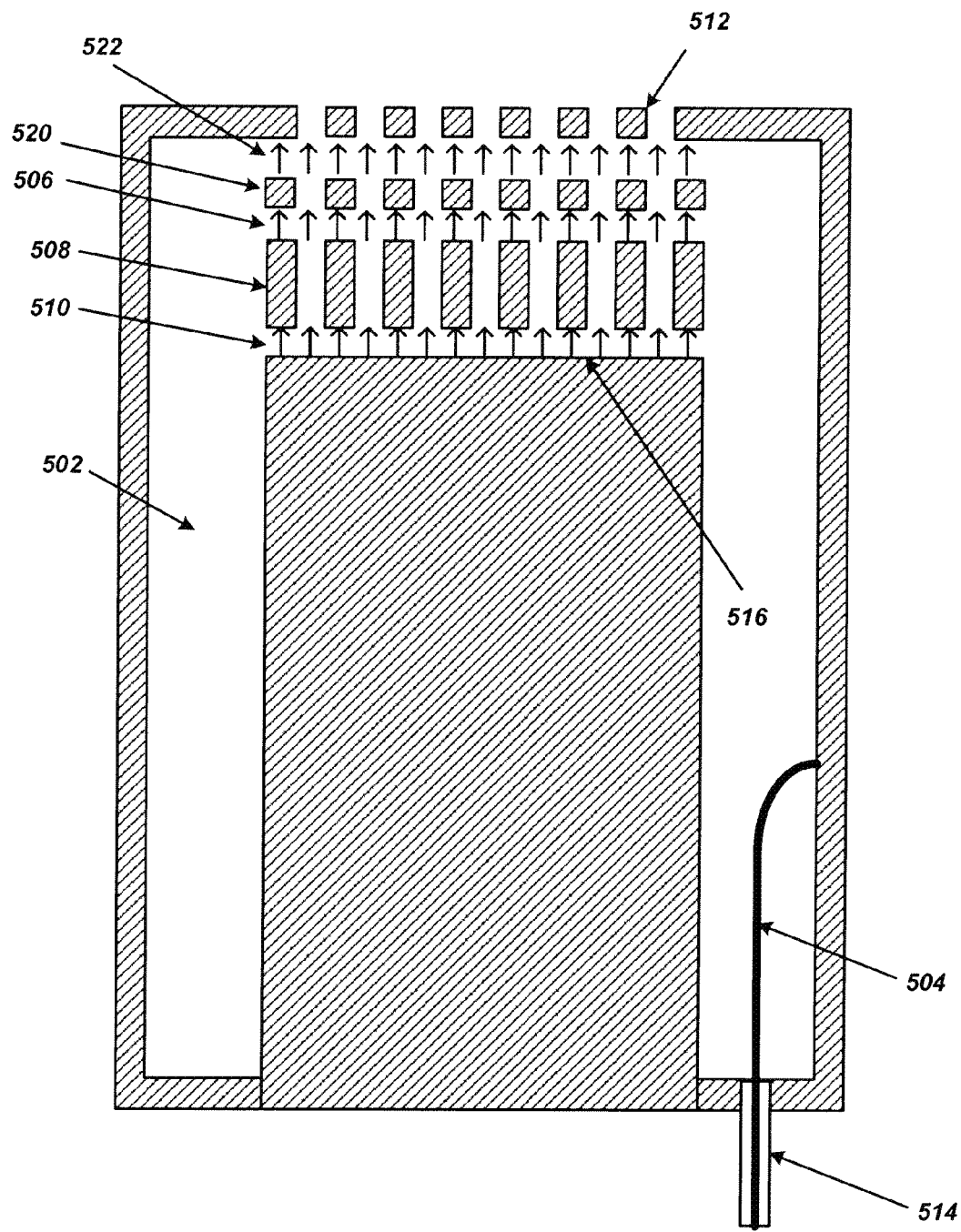
FIG. 4 is a schematic drawing of a three-grid emission-gated electron gun in accordance with an embodiment of the present invention.

FIG. 4 is an alternative embodiment of an electron gun in accordance with the present invention employing three control grids. A cathode 516 is located within an input cavity 502 and configured to emit an electron beam toward a series of control grids 508, 520, and 512. A radio frequency signal is coupled into the cavity 502 via coaxial feed line 514 and inductive coupling loop 504. As the electron beam traverses the grid-cathode (G-K) gap 510, the RF signal induces velocity modulation into the electron beam. The beam then enters a first control grid 508 that is preferentially sized to have a thickness approximately equal to one quarter of the electron beam plasma wavelength. While the electron beam is within the first control grid 508, it propagates free from interaction with the RF field, allowing the velocity modulation induced in the G-K gap 510 to create some spatial bunching of the electron beam. The electron beam then enters a second gap 506 between the first control grid 508 and a second control grid 520. Within the second gap 506, the RF field interacts with the beam, intensifying the spatial bunching. Similarly, the electron beam propagates though the second grid 520 and enters a third gap 522 between the second control grid 520 and a third control grid 512. Interaction between the electron beam and the RF field in the third gap 522 further intensifies the spatial bunching of the electron beam. In such a system, simulations indicate that bunching ratios of up to 50:1 may be achieved.

Thus, a novel apparatus and method is described for compressing the bunch length of a modulated electron beam produced by emission gating. Compression factors of fifty or more may be achieved. Those skilled in the art will likely recognize further advantages of the present invention, and it should be appreciated that various modifications, adaptations, and alternative embodiments thereof may be made within the scope and spirit of the present invention. The invention is further defined by the following claims.

What is claimed is:

1. An electron gun comprising:
   an input cavity operatively coupled to a radio-frequency drive circuit;
   an anode located outside of the input cavity;
   a cathode located within the input cavity and biased to maintain a voltage potential difference between the cathode and the anode and further adapted to emit an electron beam that propagates substantially toward the anode;
   a first control grid situated in close proximity to the cathode and defining a grid-to-cathode (G-K) gap between the cathode and the first control grid; and
   a second control grid situated in close proximity to the first control grid and defining a grid-to-grid gap between the first control grid and the second control grid; wherein:
   a radio-frequency (RF) signal from the radio-frequency drive circuit is coupled into the input cavity such that:
      the electron beam interacts with the RF signal as it propagates across the G-K gap and acquires velocity modulation;
      the electron beam is shielded from the RF signal as it propagates through the first control grid such that the velocity modulation produces spatial bunching of the electron beam; and
      the electron beam interacts with the RF signal as it propagates across the grid-to-grid gap such that the spatial bunching is intensified.

2. The electron gun of claim 1, wherein a thickness of the first control grid is selected to be larger than a thickness of the second control grid.

3. The electron gun of claim 1, wherein a thickness of the first control grid is selected to be approximately one quarter of a plasma wavelength of the electron beam.

4. The electron gun of claim 1, further comprising a third control grid situated in close proximity to the first control grid and defining a second grid-to-grid gap between the second control grid and the third control grid, wherein the electron beam interacts with the RF signal as it propagates across the second grid-to-grid gap such that the spatial bunching is further intensified.

5. The electron gun of claim 1, wherein the cathode comprises a thermionic electron source.

6. The electron gun of claim 1, wherein the cathode comprises a field-emissive cathode.

7. The electron gun of claim 1, wherein the cathode comprises a photo-emissive cathode.

8. In an electron gun including an input cavity and a cathode configured to emit an electron beam into the input cavity, a method of inducing spatial bunching of electron beam comprises the steps of:
   locating a first control grid in close proximity to the cathode to define a grid-to-cathode (G-K) gap between the cathode and the first control grid;
   coupling a radio-frequency (RF) signal to the input cavity such that the RF signal interacts with the electron beam as it traverses the G-K gap to induce a velocity modulation within the electron beam;
   allowing the electron beam to propagate through the first control grid such that the first control grid shields the electron beam from the RF signal to allow the velocity modulation to induce spatial bunching of the electron beam;
   locating a second control grid in close proximity to the first control grid to define a grid-to-grid gap between the first control grid and the second control grid;
   causing the RF signal to interact with the electron beam as it traverses the grid-to-grid gap such that the spatial bunching of the electron beam is intensified.

9. The method of inducing spatial bunching of claim 8, further comprising configuring the first control grid such that it is thicker than the second control grid.

10. The method of inducing spatial bunching of claim 8, further comprising configuring the first control grid to have a thickness approximately equal to one quarter of a plasma wavelength of the electron beam.

11. The method of inducing spatial bunching of claim 8, further comprising the steps of:
   locating a third control grid in close proximity to the second control grid to define a second grid-to-grid gap between the second control grid and the third control grid;
   allowing the electron beam to propagate through the second control grid such that the second control grid shields the electron beam from the RF signal to allow the velocity modulation to induce further spatial bunching of the electron beam; and
   causing the RF signal to interact with the electron beam as it traverses the second grid-to-grid gap such that the spatial bunching is further intensified.

12. An electron gun comprising:
   an input cavity operatively coupled to a radio-frequency drive circuit;
   an anode located outside of the input cavity;
   a cathode located within the input cavity and biased to maintain a voltage potential difference between the cathode and the anode and further adapted to emit an electron beam that propagates substantially toward the anode;
   a first control grid situated in close proximity to the cathode and defining a grid-to-cathode (G-K) gap between the cathode and the first control grid; and
   a second control grid situated in close proximity to the first control grid and defining a grid-to-grid gap between the first control grid and the second control grid; wherein:

a thickness of the first control grid is configured to be greater than a thickness of the second control grid such that the thickness of the first control grid is approximately equal to one quarter of a plasma wavelength of the electron beam; and a radio-frequency (RF) signal from the radio-frequency drive circuit is coupled into the input cavity such that:
  the electron beam interacts with the RF signal as it propagates across the G-K gap and acquires velocity modulation;
  the electron beam is shielded from the RF signal as it propagates through the first control grid such that the velocity modulation produces spatial bunching of the electron beam; and
  the electron beam interacts with the RF signal as it propagates across the grid-to-grid gap such that the spatial bunching is intensified.

13. The electron gun of claim 12, further comprising a third control grid situated in close proximity to the first control grid and defining a second grid-to-grid gap between the second control grid and the third control grid, wherein the electron beam interacts with the RF signal as it propagates across the second grid-to-grid gap such that the spatial bunching is further intensified.

14. The electron gun of claim 12, wherein the cathode comprises a thermionic electron source.

15. The electron gun of claim 12, wherein the cathode comprises a field-emissive cathode.

16. The electron gun of claim 12, wherein the cathode comprises a photo-emissive cathode.

* * * * *